(12) United States Patent
Luo et al.

(10) Patent No.: US 12,230,648 B2
(45) Date of Patent: Feb. 18, 2025

(54) DISPLAY SUBSTRATE, MANUFACTURING METHOD THEREOF AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Hao Luo, Beijing (CN); Bo Wu, Beijing (CN); Dongmei Wei, Beijing (CN); Yin Deng, Beijing (CN); Zhengdong Zhang, Beijing (CN); Yao Li, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 216 days.

(21) Appl. No.: 17/915,173

(22) PCT Filed: Oct. 28, 2021

(86) PCT No.: PCT/CN2021/127038
§ 371 (c)(1),
(2) Date: Sep. 28, 2022

(87) PCT Pub. No.: WO2022/127396
PCT Pub. Date: Jun. 23, 2022

(65) Prior Publication Data
US 2023/0123019 A1    Apr. 20, 2023

(30) Foreign Application Priority Data

Dec. 18, 2020   (CN) .......................... 202011500714.0
Jun. 25, 2021   (CN) .......................... 202110710158.8

(51) Int. Cl.
*G02F 1/1343*     (2006.01)
*G02F 1/1333*     (2006.01)
(Continued)

(52) U.S. Cl.
CPC .... *H01L 27/1288* (2013.01); *G02F 1/133345* (2013.01); *G02F 1/136227* (2013.01);
(Continued)

(58) Field of Classification Search
CPC ............ G02F 1/1333; G02F 1/133331; G02F 1/133345; G02F 1/1343; G02F 1/134309;
(Continued)

(56) References Cited

U.S. PATENT DOCUMENTS 9,716,116 B1   7/2017  Liu et al.
9,823,528 B2   11/2017 Tsai et al.
(Continued)

FOREIGN PATENT DOCUMENTS

CN    103472646 A    12/2013
CN    104007574 A    8/2014
(Continued)

*Primary Examiner* — Thoi V Duong
(74) *Attorney, Agent, or Firm* — HOUTTEMAN LAW LLC

(57) ABSTRACT

The present disclosure provides a display substrate, a manufacturing method thereof and a display apparatus, and relates to the field of display technology. The manufacturing method of a display substrate includes providing a base substrate, and forming pixels on the base substrate, wherein the forming pixels includes: forming a first auxiliary electrode on the base substrate; forming a first interlayer insulating layer on a side of the first auxiliary electrode away from the base substrate; sequentially forming a second conductive film and a first photoresist layer, exposing the first photoresist layer with a mask plate having regions of different light transmittances by controlling exposure time
(Continued)

based on requirements on an operating frequency band of the pixels, to form a source electrode and a drain electrode of the thin film transistor and a second auxiliary electrode, forming a second interlayer insulating layer; and forming a pixel electrode.

18 Claims, 6 Drawing Sheets

(51) Int. Cl.
*G02F 1/1362* (2006.01)
*G02F 1/1368* (2006.01)
*G02F 1/167* (2019.01)
*G02F 1/1676* (2019.01)
*G02F 1/1685* (2019.01)
*H01L 27/12* (2006.01)

(52) U.S. Cl.
CPC ...... *G02F 1/136286* (2013.01); *G02F 1/1368* (2013.01); *G02F 1/167* (2013.01); *G02F 1/1676* (2019.01); *G02F 1/1685* (2019.01); *H01L 27/1255* (2013.01); *G02F 1/134309* (2013.01)

(58) Field of Classification Search
CPC ............. G02F 1/134318; G02F 1/1362; G02F 1/136227; G02F 1/136272; G02F 1/136286; G02F 1/1368; G02F 1/167; G02F 1/1676; G02F 1/16766; G02F 1/1685; H01L 27/1255; H01L 27/1288
See application file for complete search history.

(56) References Cited

U.S. PATENT DOCUMENTS

| | | | |
|---|---|---|---|
| 2005/0190312 A1 | 9/2005 | Yang | |
| 2009/0244418 A1* | 10/2009 | Pak | ........................ H01L 27/124 349/39 |
| 2010/0155735 A1* | 6/2010 | Park | .................. G02F 1/136213 257/E29.294 |
| 2010/0271582 A1 | 10/2010 | Yamakawa et al. | |
| 2011/0241003 A1* | 10/2011 | Yamazaki | ........... H01L 27/1225 257/E33.053 |
| 2012/0086009 A1 | 4/2012 | Shin | |

FOREIGN PATENT DOCUMENTS

| | | |
|---|---|---|
| CN | 104423110 A | 3/2015 |
| CN | 105487315 A | 4/2016 |
| CN | 106444198 A | 2/2017 |
| CN | 107340665 A | 11/2017 |
| CN | 107402487 A | 11/2017 |
| CN | 108873552 A | 11/2018 |
| CN | 110752247 A | 2/2020 |
| CN | 110783490 A | 2/2020 |
| CN | 111739896 A | 10/2020 |
| CN | 215006189 U | 12/2021 |
| JP | 2018073860 A | 5/2018 |
| KR | 20110057062 A | 5/2011 |

* cited by examiner

DISPLAY SUBSTRATE, MANUFACTURING METHOD THEREOF AND DISPLAY APPARATUS

TECHNICAL FIELD

The present disclosure relates to the field of display technology, and in particular to a display substrate, a manufacturing method thereof and a display apparatus.

BACKGROUND

An electronic paper is a novel display apparatus and is mainly used in electronic tags, billboards, electronic readers and other devices. The electronic paper has a display effect close to that of natural paper, and may reduce the visual fatigue during reading.

In the related art, the electronic paper may generally include: a display substrate and a cover plate arranged opposite to each other, and an electrophoresis layer between the display substrate and the cover plate. The display substrate has a plurality of pixels arranged in an array, and each pixel may include: a pixel electrode, and an auxiliary electrode insulated from the pixel electrode. The pixel electrode and the auxiliary electrode may form a storage capacitor during display, to maintain a stability of a voltage loaded on the pixel electrode.

However, as the pixels per inch (PPI) in the display substrate continually increases, a size of each pixel electrode in the display substrate continually decreases, which leads to a decrease in an overlapping area between the pixel electrode and the auxiliary electrode, and thus a decrease in a capacitance of the storage capacitor formed between the pixel electrode and the auxiliary electrode. Therefore, the stability of the voltage loaded on the pixel electrode is affected, and the electronic paper manufactured by using the display substrate has a poor display effect.

SUMMARY

The present invention is directed to at least one of the technical problems in the prior art, and provides a display substrate, a method for manufacturing the same, and a display apparatus.

An embodiment of the present disclosure provides a method for manufacturing a display substrate having a plurality of pixels, the method including:

providing a base substrate and forming the pixels on the base substrate;

wherein forming the pixels includes:

forming a first conductive film on the base substrate, and patterning the first conductive film to form a gate electrode of a thin film transistor and a first auxiliary electrode;

forming a first interlayer insulating layer on a side of the first auxiliary electrode away from the base substrate;

sequentially forming a second conductive film and a first photoresist layer on a side of the first interlayer insulating layer away from the base substrate, exposing the first photoresist layer for a preset time with a mask plate having regions of different light transmittances, to form a source electrode and a drain electrode of the thin film transistor and a second auxiliary electrode; wherein orthographic projections of the first auxiliary electrode and the second auxiliary electrode on the base substrate at least partially overlap each other to form a first storage capacitor;

forming a second interlayer insulating layer on a side of a layer where the second auxiliary electrode is located away from the base substrate;

patterning the first interlayer insulating layer and the second interlayer insulating layer to form a first via extending through the first interlayer insulating layer and the second interlayer insulating layer, and a second via extending through the second interlayer insulating layer, wherein the second via exposes the drain electrode of the thin film transistor, and the first via exposes the first auxiliary electrode; and forming a pixel electrode on a side of the second interlayer insulating layer away from the base substrate; wherein the pixel electrode is connected to the drain electrode of the thin film transistor through the second via extending through the second interlayer insulating layer; and the pixel electrode is electrically connected to the first auxiliary electrode through the first via extending through the first interlayer insulating layer and the second interlayer insulating layer, and the orthographic projection of the second auxiliary electrode on the base substrate and an orthographic projection of the pixel electrode on the base substrate at least partially overlap each other to form a second storage capacitor.

The mask plate having regions of different light transmittances includes a completely transparent region, an opaque region, and a plurality of partially transparent regions; and the sequentially forming a second conductive film and a first photoresist layer on a side of the first interlayer insulating layer away from the base substrate, exposing the first photoresist layer for a preset time with a mask plate having regions of different light transmittances, to form a source electrode and a drain electrode of the thin film transistor and a second auxiliary electrode, specifically includes:

obtaining the first storage capacitor and the second storage capacitor according to a requirement for an operating frequency band of the display panel, so as to obtain an area of the orthographic projection of the second auxiliary electrode on the base substrate;

controlling light outgoing amount of the plurality of partially transparent regions by controlling exposure time, so as to control a size of a photoresist retention region of the first photoresist layer; and removing photoresist in a photoresist non-retention region in the first photoresist layer, and forming the source electrode and the drain electrode of the thin film transistor and the second auxiliary electrode by etching.

The plurality of partially transparent regions include a first partially transparent region and a second partially transparent region, and a light transmittance of the first partially transparent region is greater than that of the second partially transparent region; and where the operating frequency band of the pixels is required to be a first preset frequency band, the sequentially forming a second conductive film and a first photoresist layer on a side of the first interlayer insulating layer away from the base substrate, exposing the first photoresist layer with a mask plate having regions of different light transmittances and controlling the exposure time based on requirements on the operating frequency band of the pixels, to form a source electrode and a drain electrode of the thin film transistor and a second auxiliary electrode, specifically includes:

sequentially forming the second conductive film and the first photoresist layer on a side of the first interlayer insulating layer away from the base substrate, exposing the first photoresist layer with the mask plate having regions of different light transmittances, and controlling the exposure time to be T1, so that a region where an orthographic projection of the first photoresist layer on the base substrate overlaps an orthographic projection of the completely transparent region on the base substrate is the photoresist non-retention region, the rest region is the photoresist retention region;

removing photoresist in the photoresist non-retention region of the first photoresist layer; and etching the second conductive film to form the source electrode and the drain electrode of the thin film transistor and the second auxiliary electrode, and removing remaining photoresist; wherein a length of each of the source and drain electrodes of the thin film transistor is a first distance L1; an area of the second auxiliary electrode is a first area S1;

where the operating frequency band of the pixels is required to be a second preset frequency band, the sequentially forming a second conductive film and a first photoresist layer on a side of the first interlayer insulating layer away from the base substrate, exposing the first photoresist layer with a mask plate having regions of different light transmittances and controlling the exposure time based on requirements on the operating frequency band of the pixels, to form a source electrode and a drain electrode of the thin film transistor and a second auxiliary electrode, specifically includes:

sequentially forming the second conductive film and the first photoresist layer on a side of the first interlayer insulating layer away from the base substrate, exposing the first photoresist layer with the mask plate having regions of different light transmittances, and controlling the exposure time to be T2, so that a region where an orthographic projection of the first photoresist layer on the base substrate overlaps orthographic projections of the completely transparent region and the first partially transparent region on the base substrate is the photoresist non-retention region, the rest region is the photoresist retention region;

removing photoresist in the photoresist non-retention region of the first photoresist layer; and etching the second conductive film to form the source electrode and the drain electrode of the thin film transistor and the second auxiliary electrode, and removing remaining photoresist; wherein a length of each of the source and drain electrodes of the thin film transistor is a second distance L2; an area of the second auxiliary electrode is a second area S2; and where the operating frequency band of the pixels is required to be a third preset frequency band, the sequentially forming a second conductive film and a first photoresist layer on a side of the first interlayer insulating layer away from the base substrate, exposing the first photoresist layer with a mask plate having regions of different light transmittances and controlling the exposure time based on requirements for the operating frequency band of the pixels, to form a source electrode and a drain electrode of the thin film transistor and a second auxiliary electrode, specifically includes:

sequentially forming the second conductive film and the first photoresist layer on a side of the first interlayer insulating layer away from the base substrate, exposing the first photoresist layer with the mask plate having regions of different light transmittances, and controlling the exposure time to be T3, so that a region where an orthographic projection of the first photoresist layer on the base substrate overlaps orthographic projections of the completely transparent region, the first partially transparent region and the second partially transparent region on the base substrate is the photoresist non-retention region, the rest region is the photoresist retention region;

removing photoresist in the photoresist non-retention region of the first photoresist layer; and etching the second conductive film to form the source electrode and the drain electrode of the thin film transistor and the second auxiliary electrode, and removing remaining photoresist; wherein a length of each of the source and drain electrodes of the thin film transistor is a third distance L3; an area of the second auxiliary electrode is a third area S3;

wherein the maximum value of the first preset frequency band is less than the minimum value of the second preset frequency band, and the maximum value of the second preset frequency band is less than the minimum value of the third preset frequency band; $T1<T2<T3$; $L3<L2<L1$; $S3<S2<S1$.

While the forming the first auxiliary electrode on the base substrate, the gate electrode of the thin film transistor is further formed.

The second auxiliary electrodes of pixels in a same column are connected to a same auxiliary electrode line configured to apply a common voltage signal.

Before the sequentially forming a second conductive film and a first photoresist layer on a side of the first interlayer insulating layer away from the base substrate, exposing the first photoresist layer with a mask plate having regions of different light transmittances to form a source electrode and a drain electrode of the thin film transistor and a second auxiliary electrode, the method further includes:

forming an active layer of the thin film transistor on the side of the first interlayer insulating layer away from the base substrate.

While the sequentially forming a second conductive film and a first photoresist layer on a side of the first interlayer insulating layer away from the base substrate, exposing the first photoresist layer with a mask plate having regions of different light transmittances to form a source electrode and a drain electrode of the thin film transistor and a second auxiliary electrode, the method further includes:

forming a data line and an auxiliary electrode line, wherein the data line is electrically connected to the source electrode of the thin film transistor; and the auxiliary electrode line is connected to the second auxiliary electrode.

An extending direction of the data line is parallel or substantially parallel to that of the auxiliary electrode line.

The pixel includes two thin film transistors connected in series.

An embodiment of the present disclosure provides a display substrate having a plurality of pixels, wherein in at least one of the plurality of pixels, the display substrate includes:

a base substrate;

a thin film transistor on the base substrate and including a gate electrode, a source electrode and a drain electrode;

a first auxiliary electrode, a second auxiliary electrode and a pixel electrode sequentially arranged on the base substrate, wherein orthographic projections of the first auxiliary electrode, the second auxiliary electrode and the pixel electrode on the base substrate at least partially overlap each other;

a first interlayer insulating layer between a layer where the first auxiliary electrode is located and a layer where the second auxiliary electrode is located, so that the first auxiliary electrode is insulated from the second auxiliary electrode; and a second interlayer insulating layer between the layer where the second auxiliary electrode is located and a layer where the pixel electrode is located, so that the second auxiliary electrode is insulated from the pixel electrode; wherein the source electrode and the drain electrode of the thin film transistor and the second auxiliary electrode are arranged in a same layer and are made of a same material; the pixel electrode is connected to the drain electrode of the thin film transistor through a second via extending through the second interlayer insulating layer, and the pixel electrode is electrically connected to the first auxiliary electrode through a first via extending through the first interlayer insulating layer and the second interlayer insulating layer.

Where an operating frequency band of the pixels is a first preset frequency band, a length of each of the source and drain electrodes of the thin film transistor is a first distance L1; an area of the second auxiliary electrode is a first area S1;

where the operating frequency band of the pixels is a second preset frequency band, a length of each of the source and drain electrodes of the thin film transistor is a second distance L2; an area of the second auxiliary electrode is a second area S2; and where the operating frequency band of the pixels is a third preset frequency band, a length of each of the source and drain electrodes of the thin film transistor is a third distance L3; an area of the second auxiliary electrode is a third area S3; and wherein the maximum value of the first preset frequency band is less than the minimum value of the second preset frequency band, and the maximum value of the second preset frequency band is less than the minimum value of the third preset frequency band; T1<T2<T3; L3<L2<L1; S3<S2<S1.

The second auxiliary electrodes in a same column of pixels are connected to a same auxiliary electrode line configured to apply a common voltage signal.

The first auxiliary electrode and the gate electrode of the thin film transistor are in a same layer and are made of a same material.

The display substrate further includes a data line and an auxiliary electrode line, wherein the data line, the auxiliary electrode line and the second auxiliary electrode are in a same layer and are made of a same material; the data line is electrically connected to the source electrode of the thin film transistor; and the auxiliary electrode line is connected to the second auxiliary electrode.

An extending direction of the data line is parallel or substantially parallel to that of the auxiliary electrode line.

The pixel includes two thin film transistors connected in series.

An embodiment of the present disclosure provides a display apparatus, which includes any one of the display substrates described above.

The display apparatus is an electronic paper display apparatus; and the electronic paper display apparatus further includes a cover plate opposite to the display substrate, and an electrophoresis layer between the display substrate and the cover plate.

DETAIL DESCRIPTION OF EMBODIMENTS

In order to enable one of ordinary skill in the art to better understand the technical solutions of the present disclosure, the present invention will be described in further detail with reference to the accompanying drawings and the detailed description.

Unless defined otherwise, technical or scientific terms used herein shall have the ordinary meaning as understood by one of ordinary skill in the art to which the present disclosure belongs. The terms "first", "second", and the like used in the present disclosure are not intended to indicate any order, amount, or importance, but rather are used for distinguishing one element from another. Further, the term "a", "an", "the", or the like used herein does not denote a limitation of amount, but rather denotes the presence of at least one element. The term of "comprising", "including", or the like, means that the element or item preceding the term contains the element or item listed after the term and its equivalent, but does not exclude other elements or items. The term "connected", "coupled", or the like is not limited to physical or mechanical connections, but may include electrical connections, whether direct or indirect connections. The terms "upper", "lower", "left", "right", and the like are used only for indicating relative positional relationships, and when the absolute position of an object being described is changed, the relative positional relationships may also be changed accordingly.

It should be noted that a display substrate provided in the embodiments of the present disclosure may be used for the total reflection and used in products that do not need a backlight, such as an electronic paper. When the display substrate is used in products that do not need a backlight, a pixel electrode and a common electrode in the display substrate may be made of opaque materials.

Figure 1:
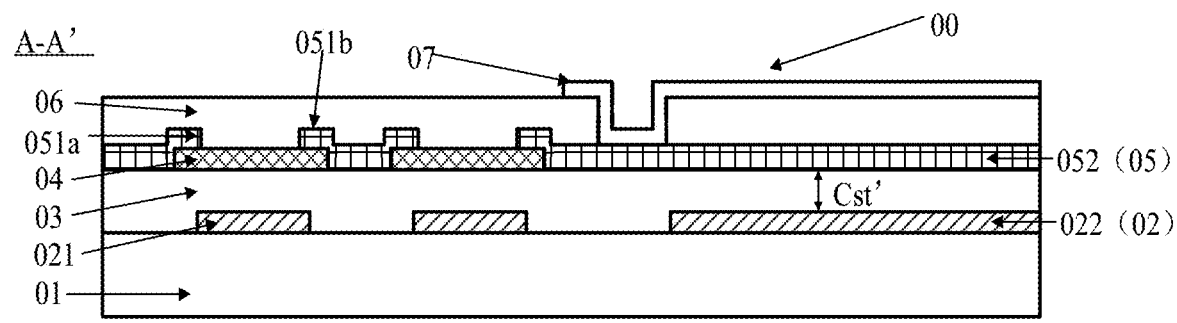
FIG. 1 is a schematic diagram of a structure of layers in a pixel of a display substrate in the related art.

FIG. 1 is a schematic diagram of a structure of layers in a pixel of a display substrate in the related art. Referring to FIG. 1, in a pixel, a display substrate may include: a base substrate 01; a first conductive pattern 02, a first interlayer insulating layer 03, an active layer 04 of a thin film transistor, a second conductive pattern 05, a second interlayer insulating layer 06, and a pixel electrode 07, which are provided on the base substrate 01 and stacked in a direction away from the base substrate 01. The first conductive pattern may include: a gate electrode 021 of the thin film transistor and a first auxiliary electrode 022, the second conductive pattern 05 may include: a source electrode 051a and a drain electrode 051b of the thin film transistor, and a second auxiliary electrode 052. The second auxiliary electrode 052 is electrically connected to the drain electrode 051b of the thin film transistor, and the second auxiliary electrode 052 is electrically connected to the pixel electrode 07 through a via in the second interlayer insulating layer 06.

Figure 2:
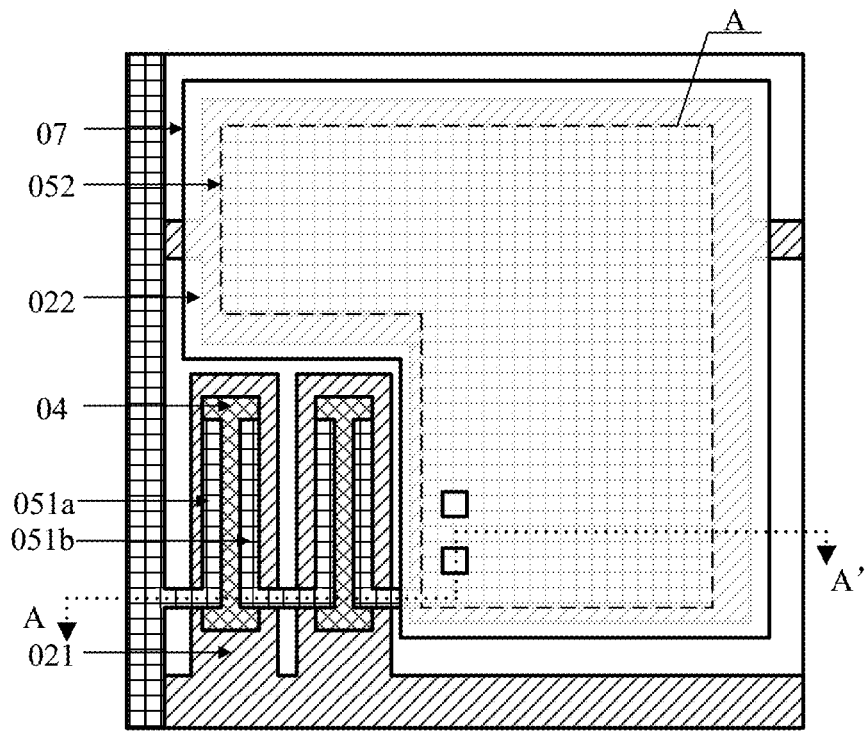
FIG. 2 is a schematic top view of the display substrate shown in FIG. 1.

Referring to FIG. 2, FIG. 2 is a schematic top view of the display substrate shown in FIG. 1. FIG. 1 is a cross-sectional view of the display substrate shown in FIG. 2 at A-A'. In the display substrate, an overlapping region A exists between an orthographic projection of the first auxiliary electrode 022 on the base substrate 01 and an orthographic projection of the second auxiliary electrode 052 on the base substrate 01.

The second auxiliary electrode 052 is connected to the pixel electrode 07 through the via in the second interlayer insulating layer 06, so that when an electronic paper manufactured by using the display substrate is used to display, the second auxiliary electrode 052 is applied with a same voltage as that for the pixel electrode 07, and the voltage is a pixel voltage. That is, the second auxiliary electrode 052 is equivalent to the pixel electrode. In this way, when the electronic paper manufactured by using the display substrate is used to display, the first auxiliary electrode 022 and the second auxiliary electrode 052 may form a storage capacitor Cst', to maintain the stability of the voltage applied to the pixel electrode 07. The greater a capacitance of the storage capacitor Cst' is, the better the effect of maintaining the stability of the voltage applied to the pixel electrode 07 is.

However, as the pixels per inch (PPI) in the display substrate continually increases, a size of each pixel in the display substrate continually decreases, which leads to a decrease in an overlapping region between the first auxiliary electrode 022 and the second auxiliary electrode 052, and thus a decrease in a capacitance of the storage capacitor Cst'. Therefore, the stability of the voltage loaded on the pixel electrode is affected, and the electronic paper manufactured by using the display substrate has a poor display effect.

Figure 3:
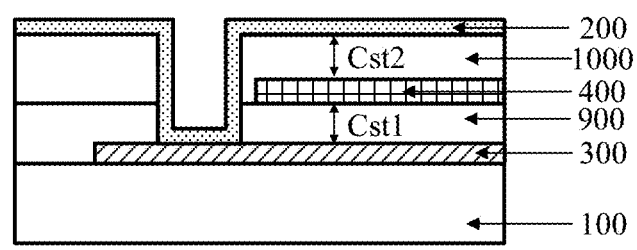
FIG. 3 is a schematic diagram of a structure of layers in a pixel of a display substrate according to an embodiment of the present disclosure.

FIG. 3 is a schematic diagram of a structure of layers in a pixel of a display substrate according to an embodiment of the present disclosure. The display substrate has a plurality of pixels arranged in an array, and in a pixel, referring to FIG. 3, the display substrate includes a base substrate 100, and a pixel electrode 200, a first auxiliary electrode 300, and a second auxiliary electrode 400 sequentially arranged along a direction away from the base substrate 100. The display substrate further includes: a first interlayer insulating layer 900 disposed between a layer where the first auxiliary electrode 300 is located and a layer where the second auxiliary electrode 400 is located, and a second interlayer insulating layer 1000 disposed between the second auxiliary electrode 400 and the pixel electrode 200. The pixel electrode 200 is electrically connected to the first auxiliary electrode 300 through a first via extending through the first interlayer insulating layer 900 and the second interlayer insulating layer 1000.

Figure 4:
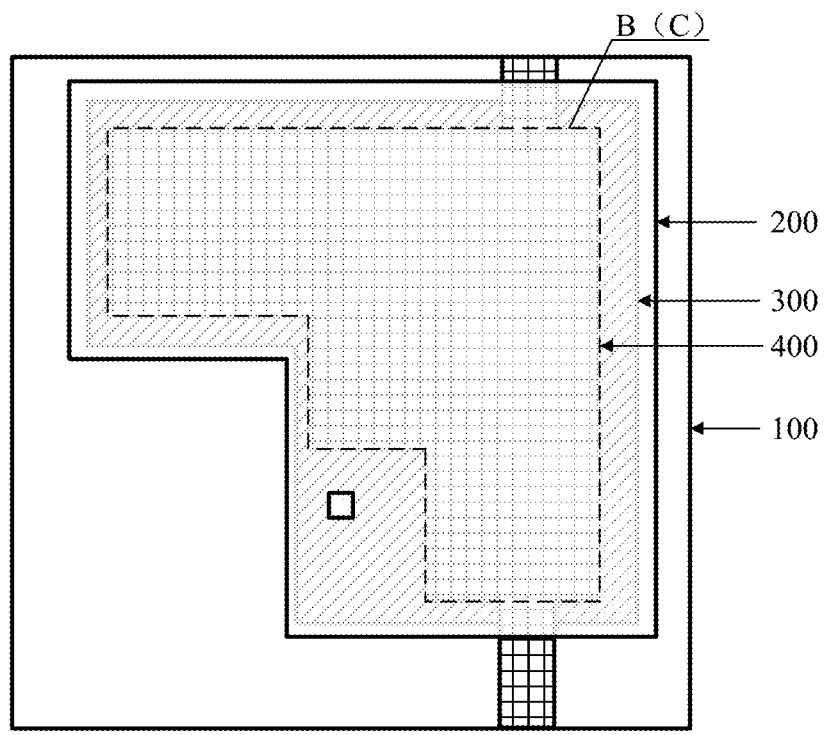
FIG. 4 is a schematic top view of the display substrate shown in FIG. 3.

Referring to FIG. 4, FIG. 4 is a schematic top view of the display substrate shown in FIG. 3. An overlapping region B exists between an orthographic projection of the second auxiliary electrode 400 on the base substrate 100 and an orthographic projection of the pixel electrode 200 on the base substrate 100, and an overlapping region C exists between the orthographic projection of the second auxiliary electrode 400 on the base substrate 100 and an orthographic projection of the first auxiliary electrode 300 on the base substrate 100.

The first auxiliary electrode 300 is connected to the pixel electrode 200, so that when the display substrate is used to display, the first auxiliary electrode 300 is applied with a same voltage as that for the pixel electrode 200, and the voltage is a pixel voltage. That is, the first auxiliary electrode 300 is equivalent to the pixel electrode 200. In this way, when the display substrate is used to display, the first auxiliary electrode 300 and the second auxiliary electrode 400 may form a first storage capacitor Cst1, and the pixel electrode 200 and the second auxiliary electrode 400 may form a second storage capacitor Cst2. The second auxiliary electrode 400 is positioned between the pixel electrode 200 and the first auxiliary electrode 300, so that the first storage capacitor Cst1 formed by the second auxiliary electrode 400 and the first auxiliary electrode 300 is connected in parallel with the second storage capacitor Cst2 formed by the second auxiliary electrode 400 and the pixel electrode 200. A capacitance of a total storage capacitor in the display substrate 000 is a sum of a capacitance of the first storage capacitor Cst1 and a capacitance of the second storage capacitor Cst1, so that the capacitance of the total storage capacitor in the display substrate 000 is larger.

In the related art, as shown in FIGS. 1 and 2, it is assumed that the overlapping region A between the orthographic projection of the first auxiliary electrode 022 on the base substrate 01 and the orthographic projection of the second auxiliary electrode 052 on the base substrate 01 has an area of S. The first interlayer insulating layer 03 between the first auxiliary electrode 022 and the second auxiliary electrode 052 may have a thickness of 4000 angstroms, and a material of the first interlayer insulating layer 03 may include: silicon nitride, which has a relative dielectric constant of 6.5.

Then, the capacitance Ci' of the storage capacitor Cst' may be calculated as:

$$Ci' \approx \frac{8.845 \times 10^{-18} \times 6.5}{4000} \times 10000 \times S = 1.44 \times 10^{-16} \times S \quad (1)$$

In the embodiment of the present disclosure, as shown in FIGS. 3 and 4, it is assumed that the overlapping region B between the orthographic projection of the second auxiliary electrode 400 on the base substrate 100 and the orthographic projection of the pixel electrode 200 on the base substrate 100 has an area S, and the overlapping region C between the orthographic projection of the second auxiliary electrode 400 on the base substrate 100 and the orthographic projection of the first auxiliary electrode 300 on the base substrate 100 has an area S. A thickness and a material of an insulating layer between the first auxiliary electrode 300 and the second auxiliary electrode 400 are the same as those of the first interlayer insulating layer 03 in the related art, respectively, so that the capacitance $Ci_1$ of the first storage capacitor Cst1 is equal to the capacitance Ci' of the storage capacitor Cst' in the related art. The thickness of the insulating layer between the second auxiliary electrode 400 and the pixel electrode 200 may be in a range of: 2000 to 6000 angstroms, the insulating layer is made of the same material as the first interlayer insulating layer 03, and has a relative dielectric constant of 6.5.

Then, a minimum value $Ci_{2,min}$ of the capacitance of the second storage capacitor Cst2 may be calculated is:

$$Ci_{2,min} \approx \frac{8.845 \times 10^{-18} \times 6.5}{6000} \times 10000 \times S = 9.59 \times 10^{-17} \times S \quad (2)$$

A maximum value $Ci_{2,max}$ of the capacitance of the second storage capacitor Cst2 is:

$$Ci_{2,max} \approx \frac{8.845 \times 10^{-18} \times 6.5}{2000} \times 10000 \times S = 2.87755 \times 10^{-16} \times S \quad (3)$$

Therefore, in the present application, a range of the capacitance Ci of the total storage capacitor in the display substrate 000 is:

$$Ci = Ci_1 + Ci_2 = 2.399 \times 10^{-16} \times S \sim 4.21 \times 10^{-16} \times S \quad (4)$$

As may be seen from the above, the capacitance Ci of the total storage capacitor in the display substrate 000 in the embodiment of the present application may be improved by 67% to 192% compared to the capacitance Ci' of the storage capacitor in the display substrate 00 in the related art.

In summary, the first auxiliary electrode 300 is connected to the pixel electrode 200 in the display substrate in the embodiment of the present disclosure, so that when an electronic paper manufactured by using the display substrate is used to display, the first auxiliary electrode 300 is applied with a same voltage as that for the pixel electrode 200, and the voltage is a pixel voltage. That is, the first auxiliary electrode 300 is equivalent to the pixel electrode 200. In this way, when the electronic paper is used to display, the first auxiliary electrode 300 and the second auxiliary electrode 400 may form the first storage capacitor Cst1, and the pixel electrode 200 and the second auxiliary electrode 400 may form the second storage capacitor Cst2. The first storage capacitor Cst1 is connected in parallel with the second storage capacitor Cst2, and the capacitance of the total storage capacitor in the display substrate is the sum of the capacitance of the first storage capacitor Cst1 and the capacitance of the second storage capacitor Cst1. Compared with the related art, in the electronic paper in the embodiment of the present disclosure, without changing the PPI of the electronic paper, the capacitance of the storage capacitor is increased, the stability of the voltage loaded on the pixel electrode 200 is improved, thereby improving the display effect of the electronic paper.

Figure 5:
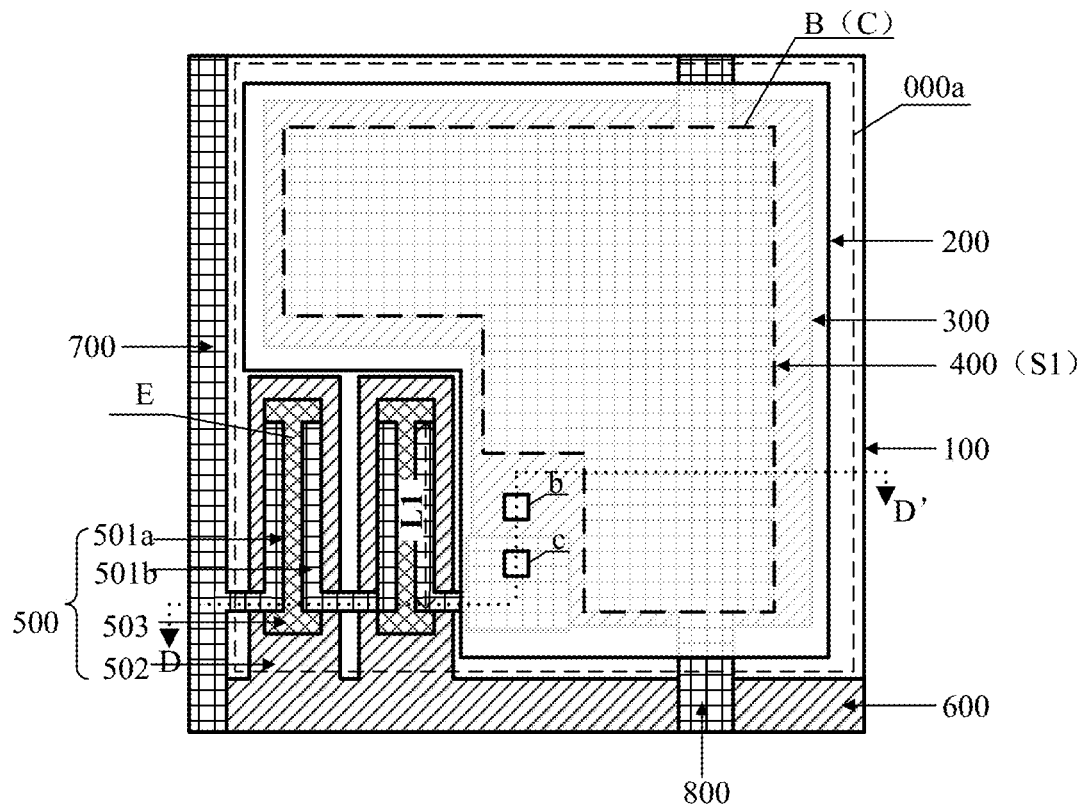
FIG. 5 is a top view of another display substrate according to an embodiment of the present disclosure.
Figure 6:
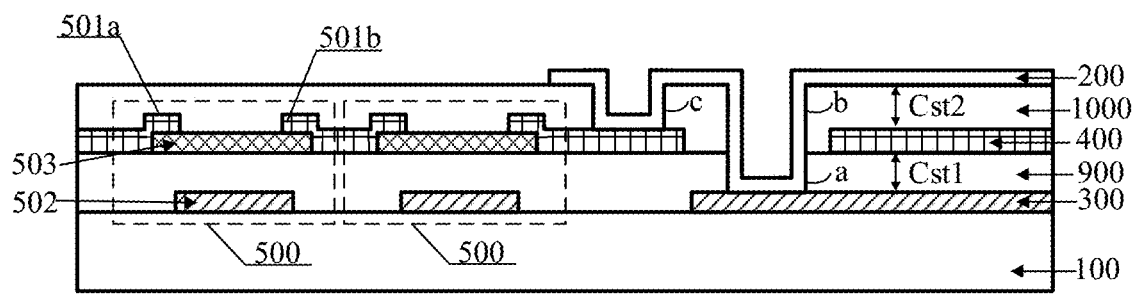
FIG. 6 is a cross-sectional view of the display substrate shown in FIG. 5 at D-D'.

In the embodiment of the present application, referring to FIGS. 5 and 6, FIG. 5 is a top view of another display substrate according to an embodiment of the present disclosure. FIG. 6 is a cross-sectional view of the display substrate shown in FIG. 5 at D-D'. The pixel of the display substrate may further include: a thin film transistor 500 (TFT) having a drain electrode electrically connected to the pixel electrode 200.

In some examples, a source electrode 501a and a drain electrode 501b of the thin film transistor may be disposed in a same layer as the second auxiliary electrode 400 and may be made of the same material as the second auxiliary electrode 400. That is, the source and drain electrodes 501a and 501b of the thin film transistor and the second auxiliary electrode 400 may be formed through one patterning process. Alternatively, the source and drain electrodes 501a and 501b of the thin film transistor may be disposed in the same layer as the first auxiliary electrode 300. That is, the source and drain electrodes 501a and 501b of the thin film transistor and the first auxiliary electrode 300 may be formed through one patterning process. Therefore, the manufacturing process for the display substrate may be simplified, and the manufacturing difficulty and the manufacturing cost for the display substrate are reduced. It should be noted that FIG. 5 schematically illustrates that the source electrode 501a and the drain electrode 501b of the thin film transistor and the second auxiliary electrode 400 are disposed in the same layer and made of the same material.

Further, the second auxiliary electrode 400 may be used as a common electrode in the pixel, so that a thickness of layers of the display substrate may be reduced, thereby realizing the lightness and thinness of the display substrate. Specifically, the second auxiliary electrodes 400 located in a same column of pixels are connected to a same auxiliary electrode line configured to apply a common voltage signal.

In some examples, a gate electrode 502 in the thin film transistor 500 may be disposed in the same layer as the first auxiliary electrode 300 and be made of the same material as the first auxiliary electrode 300; the source and drain electrodes 501a and 501b in the thin film transistor 500 may be disposed in the same layer as the second auxiliary electrode 400 and be made of the same material as the second auxiliary electrode 400. In this case, the gate electrode 502 of the thin film transistor and the first auxiliary electrode 300 may be formed through one patterning process, and the source and drain electrodes 501a and 501b of the thin film transistor and the second auxiliary electrode 400 may be formed through one patterning process. Thus, the manufacturing process of the display substrate may be further simplified, and the manufacturing difficulty and the manufacturing cost of the display substrate 000 may be further reduced.

In some examples, an active layer 503 of the thin film transistor laps the source and drain electrodes 501a and 501b, the source and drain electrodes 501a and 501b are located on a side of the active layer 503 away from the base substrate 100, and the gate electrode 502 is located on a side of the active layer 503 close to the base substrate 100. That is, the thin film transistor 500 is a bottom gate thin film transistor. In other possible implementations, the thin film transistor 500 may alternatively be a top gate thin film transistor, which is not limited in the present disclosure.

In the disclosed embodiment, referring to FIGS. 5 and 6, the display substrate has a plurality of pixel regions 000a arranged in an array, and each pixel region 000a is provided with two thin film transistors 500 connected in series.

Each of the two thin film transistors 500 may include: a source electrode 501a and a drain electrode 501b. The drain electrode 501b in one thin film transistor 500 is electrically connected to the source electrode 501a in the other thin film transistor 500, so that the two thin film transistors 500 are connected in series. In this way, an influence of a leakage current in the thin film transistor 500 on the pixel voltage applied to the pixel electrode 200 may be reduced. Alternatively, only one thin film transistor 500 may be included in each pixel.

For example, as shown in FIG. 5, the active layer 503 in each thin film transistor 500 has an elongated channel region E. It should be noted that the channel region E of the active layer pattern 503 refers to a region of the active layer 503 between a region where the active layer 503 contacts the source electrode and a region where the active layer 503 contacts the drain electrode. A width of the channel region E may be in a range of 20 to 40 microns. Thus, a requirement for a charging rate of the display substrate 000 may be satisfied.

In the embodiment of the present disclosure, an operating frequency band of the pixels varies according to different application scenarios of different products; and the first storage capacitor Cst1, the second storage capacitor Cst2, and a ratio of a width to a length of a channel (a width-to-length ratio of the channel or a channel width-to-length ratio) of the thin film transistor 500 in the pixel also varies according to a requirement for the operating frequency band of the pixels. For example: when a flexible electronic paper is applied to an outdoor display board or an electronic tag, in order to reduce power consumption, a lower operating frequency (10 HZ to 20 HZ) is required; when the electronic paper is applied to an e-book supporting handwriting, a higher operating frequency (≥120 HZ) is required because the handwriting is needed without delay. For a product with a higher operating frequency, a smaller storage capacitor and a correspondingly smaller channel width-to-length ratio of the thin film transistor 500 are required due to a shorter charging time; for a product with a lower operating frequency, a larger storage capacitor and a correspondingly larger channel width-to-length ratio of the thin film transistor 500 are required to ensure that the leakage meets the requirement when refreshing a next frame. The display substrate in the embodiments of the present disclosure may be applied to a display apparatus such as a reflective display apparatus and a reflective electronic paper.

Figure 7:
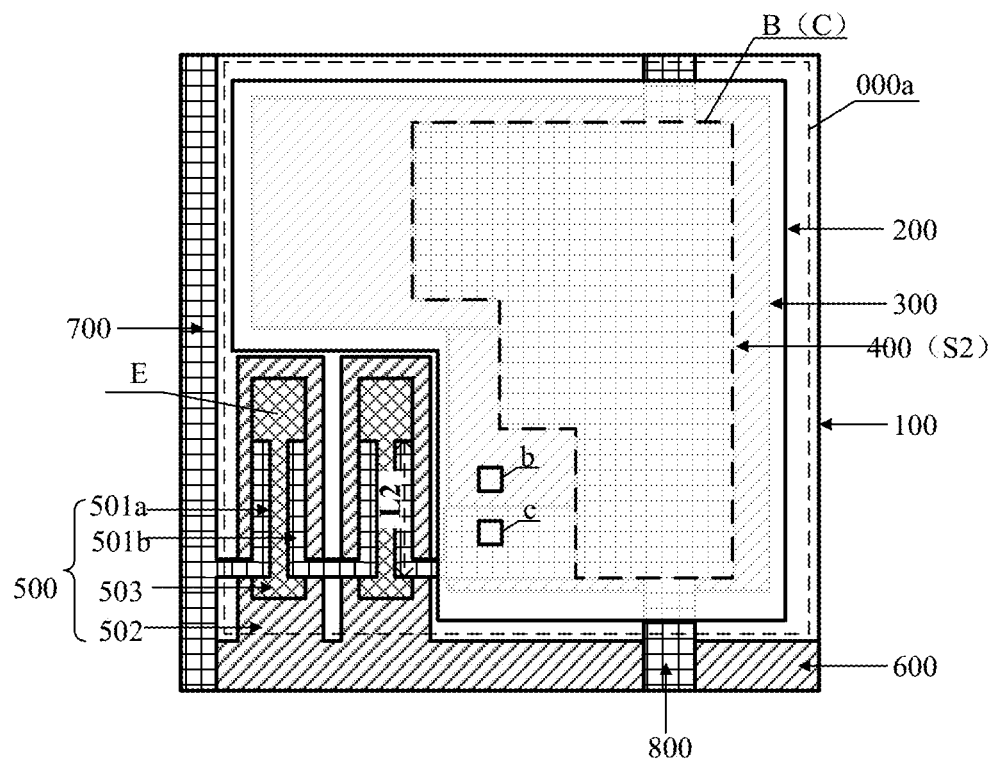
FIG. 7 is a top view of another display substrate according to an embodiment of the present disclosure.
Figure 8:
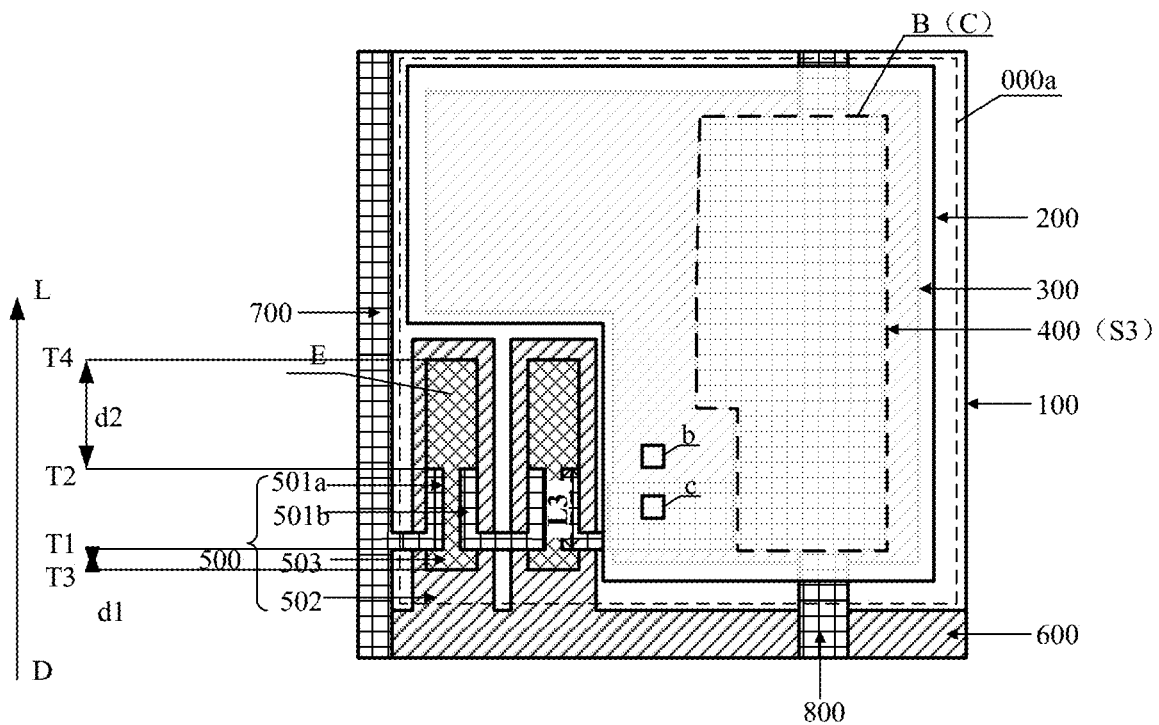
FIG. 8 is a top view of another display substrate according to an embodiment of the present disclosure.

In some examples, as shown in FIG. 5, when an operating frequency band of the pixels is a first preset frequency band, a length of each of the source electrode 501a and the drain electrode 501b of the thin film transistor in the pixel is L1, and an area of the second auxiliary electrode 400 is S1. As shown in FIG. 7, when the operating frequency band of the pixels is a second preset frequency band, the length of each of the source electrode 501a and the drain electrode 501b of the thin film transistor in the pixel is L2, and the area of the second auxiliary electrode 400 is S2. As shown in FIG. 8, when the operating frequency band of the pixels is a third preset frequency band, the length of each of the source electrode 501a and the drain electrode 501b of the thin film transistor in the pixel is L3, and the area of the second auxiliary electrode 400 is S3. The maximum value of the first preset frequency band is smaller than the minimum value of the second preset frequency band, and the maximum value of the second preset frequency band is smaller than the minimum value of the third preset frequency band; L3<L2<L1; S3<S2<S1. It should be noted that the length of each of the source electrode 501a and the drain electrode 501b of the thin film transistor is a channel width of the thin film transistor 500, and the larger the length of each of the source electrode 501a and the drain electrode 501b of the thin film transistor is, the larger the channel width-to-length ratio is. It should be noted that to implement the design of the channel width-to-length ratio and the storage capacitor of the thin film transistor 500 in the pixels of different operating frequency bands, the following method for manufacturing a display substrate is specifically described. From FIG. 8, along a direction DL of the length of source electrode 501a (i.e., in a direction perpendicular to a direction from the source electrode 501a to the drain electrode 501b), the source electrode 501a includes a first terminal T1 and a second terminal T2 opposite to each other, and the active layer 503 includes a third terminal T3 close to the first terminal T1 and a fourth terminal T4 close to the second terminal T2, and a first distance d1 between the first terminal T1 and the third terminal T3 is smaller than a second distance d2 between the second terminal T2 and the fourth terminal T4.

In an embodiment of the present disclosure, as shown in FIG. 5, the display substrate may further include: a plurality of gate lines 600, a plurality of data lines 700, and a plurality of auxiliary electrode lines 800. Extending directions of each gate line 600 and each data line 700 intersect with each other, for example, perpendicular to each other. Extending directions of each auxiliary electrode line 800 and each data line 700 are substantially the same or the same. In some examples, gate electrodes 502 of the thin film transistors 500 in the pixels in the same row are connected to the same gate line 600, source electrodes 501a of the thin film transistors 500 in the pixels in the same column are connected to the same data line 700, and the second auxiliary electrodes 400 in the pixels in the same column are connected to the same auxiliary electrode line 800.

Illustratively, the gate lines 600, the gate electrodes 502 of the thin film transistors, and the first auxiliary electrode 300 are disposed in the same layer and made of the same material. That is, the gate lines 600, the gate electrodes 502, and the first auxiliary electrode 300 are formed through one patterning process. The data lines 700, the auxiliary electrode lines 800, the source and drain electrodes 501a and 501b and the second auxiliary electrode 400 are arranged in the same layer, and made of the same material. That is, the data lines 700, the auxiliary electrode lines 800, the source and drain electrodes 501a and 501b, and the second auxiliary electrode 400 are formed through one patterning process.

The extending direction of each gate line 600 intersects with the extending direction of each data line 700, and the extending direction of each auxiliary electrode line 800. The gate lines 600 and the data lines 700, having the extending directions intersecting with each other, may define a plurality of pixel regions 000a in the display substrate 000. For example, any two adjacent gate lines 600 and any two adjacent data lines 700 may enclose one pixel region 000a.

In some examples, the extending direction of each data line 700 may be perpendicular to the extending direction of each gate line 600, and may be parallel to that of each auxiliary electrode line 800. The gate lines 600 and the data lines 700, having the extending directions perpendicular to each other, define the plurality of pixel regions 000a as rectangles in the display substrate 000.

Further, a width of each data line 700 is smaller than that of each auxiliary electrode line 800. Thus, the width of the data line 700 is small, and an overlapping area of the data line 700 and the gate line 600 may be reduced, so that a parasitic capacitance generated between the data line 700 and the gate line 600 is reduced, and the influence of the parasitic capacitance on the display effect of the electronic paper including the display substrate 000 is reduced. When the display apparatus including the display substrate 000 displays, the voltage loaded on the auxiliary electrode line 800 is constant, so that the parasitic capacitance generated between the auxiliary electrode line 800 and the gate line 600 does not affect the display effect of the electronic paper. The width of the auxiliary electrode line 800 may be larger, so as to increase the strength of the electronic paper and reduce the probability of damage to the electronic paper in use.

In some examples, the pixel electrode 200 is connected to the first auxiliary electrode 300 through a first via extending through the first interlayer insulating layer 900 and the second interlayer insulating layer 1000. The first via includes a first sub-via a and a second sub-via b. The first sub-via a extends through the first interlayer insulating layer, the second sub-via b extends through the second interlayer insulating layer, and the pixel electrode is electrically connected to the first auxiliary electrode 300 through the first sub-via a and the second sub-via b.

In the embodiment of the present disclosure, an orthographic projection of the first sub-via a on the base substrate 100 is located within an orthographic projection of the second sub-via b on the base substrate 100.

Optionally, in the embodiment of the present disclosure, the second interlayer insulating layer further has a second via through which the pixel electrode 200 is electrically connected to the drain electrode of the thin film transistor 500.

It should be noted that the first interlayer insulating layer 900 may also serve as a gate insulating layer to insulate the active layer 503 from the gate electrode 502 in the thin film transistor 500.

In the embodiment of the present disclosure, as shown in FIG. 5, an orthographic projection of the second auxiliary electrode 400 on the base substrate 100 is located within an orthographic projection of the first auxiliary electrode 300 on the base substrate 100, which is located within an orthographic projection of the pixel electrode 200 on the base substrate 100. Thus, each of the areas of the overlapping region B between the orthographic projection of the second auxiliary electrode 400 on the base substrate 100 and the orthographic projection of the pixel electrode 200 on the base substrate 100, and the overlapping region C between the orthographic projection of the second auxiliary electrode 400 on the base substrate 100 and the orthographic projection of the first auxiliary electrode 300 on the base substrate 100 is an area of the second auxiliary electrode 400. That is, the overlapping area B between the orthographic projection of the second auxiliary electrode 400 on the base substrate 100 and the orthographic projection of the pixel electrode 200 on the base substrate 100, and the overlapping area C between the orthographic projection of the second auxiliary electrode 400 on the base substrate 100 and the orthographic projection of the first auxiliary electrode 300 on the base substrate 100 coincide with each other. In this way, the capacitance Ci of the total storage capacitor in the display substrate 000 may be changed by changing the area of the second auxiliary electrode 400. Illustratively, the larger the area of the second auxiliary electrode 400 is, the larger the capacitance Ci of the total storage capacitor in the display substrate 000 is. Conversely, the smaller the area of the second auxiliary electrode 400 is, the smaller the capacitance Ci of the total storage capacitor in the display substrate 000 is.

It should be noted that the capacitance Ci of the total storage capacitor in the display substrate 000 may alternatively be changed by changing a thickness of the second insulating layer 1000. Illustratively, the larger the thickness of the second insulating layer 1000 is, the smaller the capacitance Ci of the total storage capacitor in the display substrate 000 is. Conversely, the smaller the thickness of the second insulating layer 1000 is, the larger the capacitance Ci of the total storage capacitor in the display substrate 000 is.

It should be noted that there is no overlapping area between the orthographic projection of the first auxiliary electrode 300 on the base substrate 100 and orthographic projections of the source electrode 501a and the drain electrode 501b of the thin film transistor on the base substrate 100, so that the electric field interference between the first auxiliary electrode 300 and the source and drain electrodes 501a and 501b may be avoided.

Figure 9:
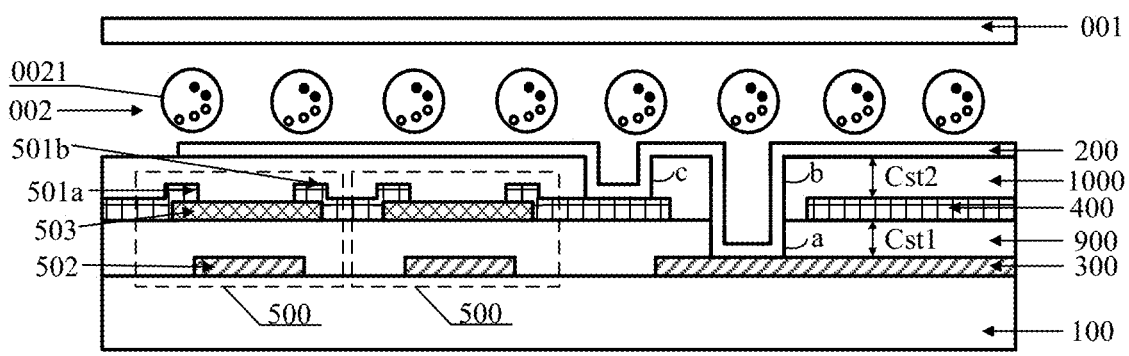
FIG. 9 is a cross-sectional view of another display apparatus according to an embodiment of the present disclosure.

In the embodiment of the present disclosure, referring to FIG. 9, FIG. 9 is a schematic diagram of a structure of layers of a display apparatus according to an embodiment of the present disclosure. The display apparatus is an electronic paper, and includes not only the display substrate described above, but also a cover plate 001 disposed opposite to the display substrate, and an electrophoresis layer 002 disposed between the display substrate and the cover plate 001.

The electrophoresis layer 002 in the electronic paper may include: a plurality of electrophoresis capsules 0021; each electrophoresis capsule 0021 may include: a capsule body, and electrophoresis fluid and charged particles in the capsule body; the charged particles may include: black particles, white particles, colored particles, or the like.

In this application, when a voltage is applied to the pixel electrode 400 in the display substrate 000, the pixel electrode 400 and the common electrode (the second auxiliary electrode 400) form a voltage difference therebetween. Under the voltage difference, the charged particles in each electrophoresis capsule 0021 move in the electrophoresis liquid, so as to realize the display of the electronic paper.

In summary, the electronic paper provided by the embodiment of the present application includes: a display substrate, a cover plate 001 and an electrophoresis layer 002. The first auxiliary electrode 300 is electrically connected to the pixel electrode 200 in the display substrate, so that when the electronic paper is used to display, the first auxiliary electrode 300 is applied with a same voltage as that for the pixel electrode 200, and the voltage is a pixel voltage. That is, the first auxiliary electrode 300 is equivalent to the pixel electrode 200. In this way, when the electronic paper is used to display, the first auxiliary electrode 300 and the second auxiliary electrode 400 may form the first storage capacitor Cst1, and the pixel electrode 200 and the second auxiliary electrode 400 may form the second storage capacitor Cst2. The first storage capacitor Cst1 is connected in parallel with the second storage capacitor Cst2, and the capacitance of the total storage capacitor in the display substrate is the sum of the capacitance of the first storage capacitor Cst1 and the capacitance of the second storage capacitor Cst1. Compared with the related art, in the electronic paper in the embodiment of the present disclosure, without changing the PPI of the electronic paper, the capacitance of the storage capacitor is increased, the stability of the voltage loaded on the pixel electrode is improved, thereby improving the display effect of the electronic paper.

The method for manufacturing the display substrate provided by the embodiment of the present disclosure may form the display substrate in any one of FIGS. 5, 7 and 8. The method includes: providing a base substrate and forming pixels on the substrate. The step of forming the pixels includes:

forming a first auxiliary electrode on a base substrate;
forming a first interlayer insulating layer on a side of the first auxiliary electrode away from the base substrate;
sequentially forming a second conductive film and a first photoresist layer on a side of the first interlayer insulating layer away from the base substrate, exposing the first photoresist layer with a mask plate having regions of different light transmittances, and controlling the exposure time based on requirements on the operating frequency band of pixels to form a source electrode and a drain electrode of a thin film transistor and a second auxiliary electrode; wherein orthographic projections of the first auxiliary electrode and the second auxiliary electrode on the base substrate overlap each other to form a first storage capacitor.
forming a second interlayer insulating layer on a side of a layer where the second auxiliary electrode is located, away from the base substrate.
forming a pixel electrode on a side of the second interlayer insulating layer away from the base substrate; wherein the pixel electrode is connected to the drain electrode of the thin film transistor through a second via extending through the second interlayer insulating layer; the pixel electrode is electrically connected to the first auxiliary electrode through a first via extending through the first interlayer insulating layer and the second interlayer insulating layer, and the orthographic projection of the second auxiliary electrode on the base substrate and an orthographic projection of the pixel electrode on the base substrate at least partially overlap each other, to form a second storage capacitor.

According to the embodiment of the present disclosure, the source electrode and the drain electrode of the thin film transistor and the second auxiliary electrode in the pixel are formed with a mask plate having regions of different light transmittances, so that sizes of the source electrode and the drain electrode of the formed thin film transistor and the second auxiliary electrode may be controlled by controlling the exposure time according to requirements on the operating frequency band of the pixels for the product applying the display substrate, and further the channel width-length ratio of the thin film transistor and capacitance values of the first storage capacitor and the second storage capacitor are controlled, to meet the product requirements.

In some examples, the mask plate having regions of different light transmittances used in the embodiments of the present disclosure may be a half-tone mask plate or a gray-tone mask plate, and the types of the mask plate are not limited in the embodiments of the present disclosure, as long as the mask plate has three or more regions with different light transmittances.

Figure 10:
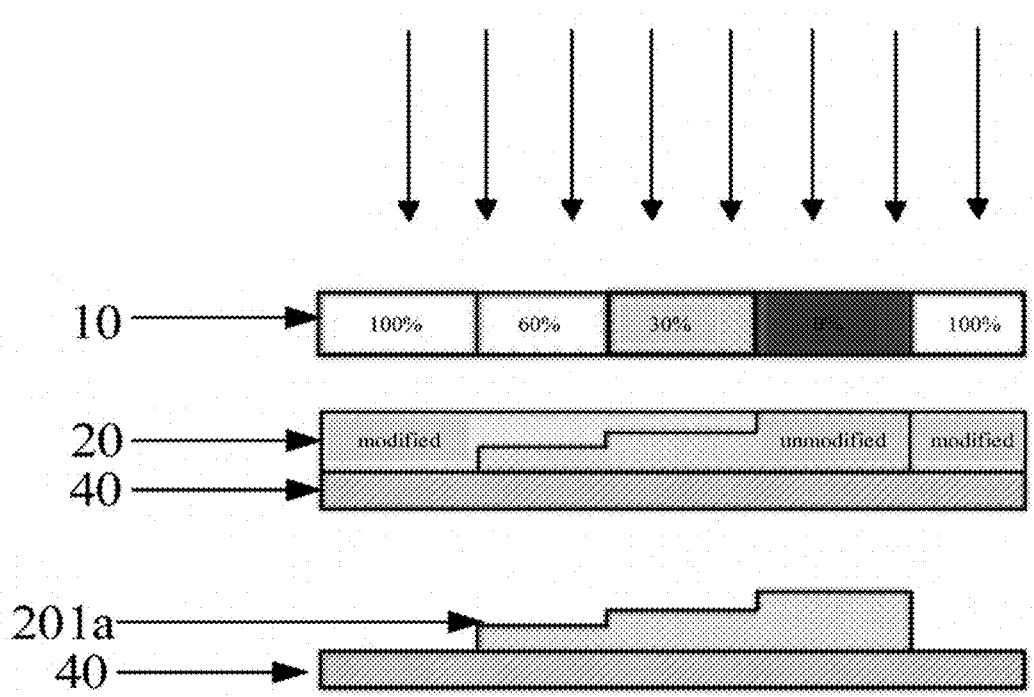
FIG. 10 is a schematic diagram of an exposure performed with mask plates with different accuracies where an operating frequency band of pixels is a first preset frequency band in a method for manufacturing a display substrate according to the embodiment of the present disclosure.
Figure 11:
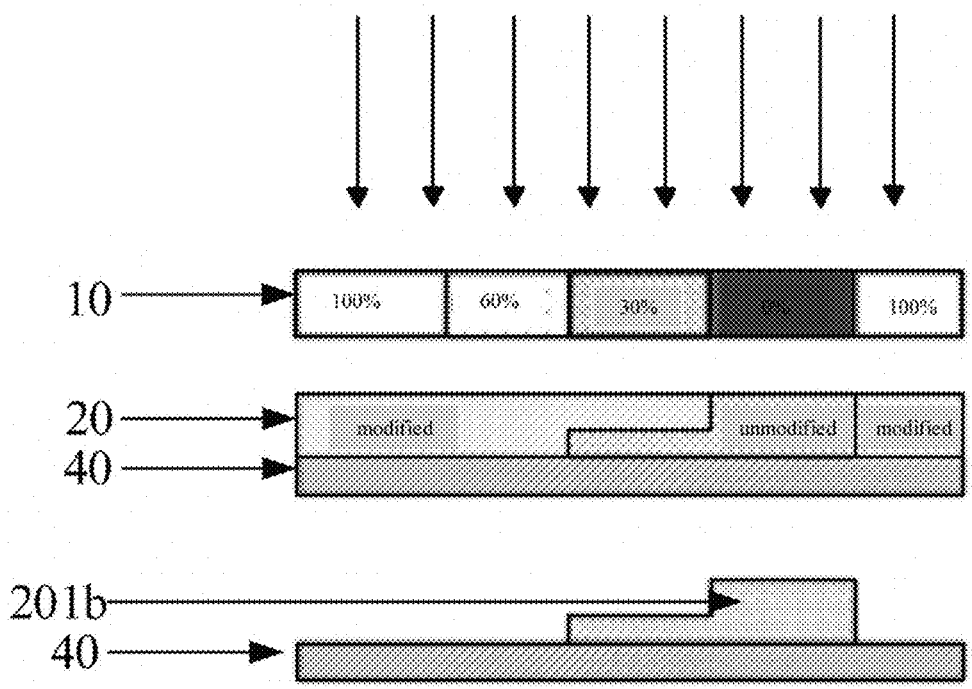
FIG. 11 is a schematic diagram of an exposure performed with mask plates with different accuracies where an operating frequency band of pixels is a second preset frequency band in a method for manufacturing a display substrate according to the embodiment of the present disclosure.
Figure 12:
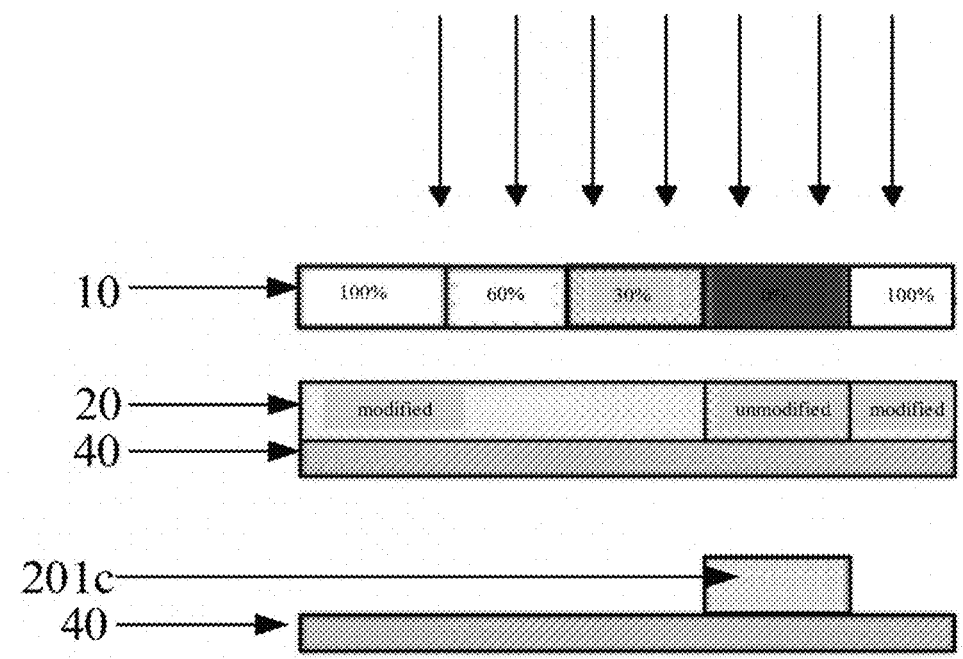
FIG. 12 is a schematic diagram of an exposure performed with mask plates with different accuracies where an operating frequency band of pixels is a third preset frequency band in a method for manufacturing a display substrate according to the embodiment of the present disclosure.

In order to clarify the method for manufacturing the display substrate according to the embodiment of the present disclosure, in conjunction with the display substrate of any one of FIGS. 5 to 8, and as shown in FIGS. 10 to 12, an exemplary method for manufacturing a display substrate is provided as follows. The method includes the following steps:

S11, forming a first conductive pattern on the base substrate 100.

In some examples, a material of the first conductive pattern may include: molybdenum (Mo), titanium (Ti), copper (Cu), aluminum (Al) or alloy material. The first conductive pattern may include: the gate electrode 502 of the thin film transistor and the first auxiliary electrode 300 in each pixel and gate lines 600. The gate electrodes 502 of the thin film transistors in the pixels in the same row are connected to the same gate line 600.

In some examples, step S11 may include forming a first conductive film on the base substrate 100 by any one of a plurality of methods, such as deposition, coating, sputtering, etc., and then performing a patterning process on the first conductive film to form the first conductive pattern, that is, forming the gate electrode 502 of the thin film transistor and the first auxiliary electrode 300 in each pixel and gate lines 600.

S12, forming a first interlayer insulating layer 900 on the first conductive pattern, and forming a first sub-via a extending through the first interlayer insulating layer.

In some examples, the first interlayer insulating layer 900 serves as a gate insulating layer, and a material of the first interlayer insulating layer 900 includes, but is not limited to, silicon dioxide, silicon nitride, or a high dielectric constant material.

In some examples, the step S12 may include forming a first insulating film on the base substrate 100 formed with the first conductive pattern by any one of a plurality of methods, such as deposition, coating, sputtering, etc., and then performing a patterning process on the first insulating film, to form the first interlayer insulating layer 900 having the first sub-via.

S13, forming an active layer 503 of the thin film transistor in the pixel on the first interlayer insulating layer 900.

In some examples, a material of the active layer may include, but not limited to, poly-silicon, amorphous silicon, an oxide semiconductor material or any other semiconductor material.

In some examples, the step S13 may include forming an active layer film on the base substrate 100 on which the first interlayer insulating layer 900 is formed by any one of a plurality of methods, such as deposition, coating, sputtering, etc., and then performing a patterning process on the active layer film to form the active layer.

S14, forming a second conductive pattern on the active layer, with a mask plate 10 having regions of different light transmittances and controlling the exposure time based on requirements on the operating frequency band of the pixels.

In some examples, a material of the second conductive pattern may include: Mo, Ti, Cu, Al or an alloy material. The second conductive pattern may include: the source electrode 501a and the drain electrode 501b of the thin film transistor, the second auxiliary electrode 400, the data lines 700, and the auxiliary electrode lines 800.

In some examples, the second auxiliary electrode 400 further serves as the common electrode, which may reduce the thickness of layers of the display substrate, thereby realizing the lightness and thinness of the product.

In some examples, the mask plate 10 having regions of different light transmittances used in the step S14 includes a completely transparent region (100% light transmittance), an opaque region (0% light transmittance), and a plurality of partially transparent regions. The step S14 may include the following steps:

S141, sequentially forming a second conductive film 40 and a first photoresist layer 20 on a side of the first interlayer insulating layer 900 away from the base substrate 100.

S142, exposing the first photoresist layer 20 with the mask plate 10 having regions of different light transmittances, and controlling the exposure time based on requirements on the operating frequency band of pixels to control the light outgoing amount of the plurality of partially transparent regions, so as to control a size of a photoresist retention region of the first photoresist layer 20.

S143, removing photoresist in a photoresist non-retention region in the first photoresist layer 20, and forming the second conductive pattern by etching.

The step S14 is further described below by taking an example where the mask plate having regions of different light transmittances includes a completely transparent region (100% light transmittance), an opaque region (0% light transmittance), a first partially transparent region and a second partially transparent region. The light transmittance of the first partially transparent region is different from that of the second partially transparent region. For example, the light transmittance of the first partially transparent region is 60%, and the light transmittance of the second partially transparent region is 30%. Pixels meeting requirements on three different operating frequency bands may be manufactured with such a mask plate. The three different operating frequency bands are a first preset frequency band, a second preset frequency band and a third preset frequency band, respectively. As an example, the first preset frequency band is in a range of 10 Hz to 20 Hz; the second preset frequency band is in a range of 20 Hz to 120 Hz; and the third preset frequency band is not less than 120 Hz.

Referring to FIGS. 10 and 5, when the operating frequency band of the pixels is required to be the first preset frequency band, the step S14 may include sequentially forming the second conductive film 40 and the first photoresist layer 10 on a side of the first interlayer insulating layer 900 away from the base substrate 100, exposing the first photoresist layer with the mask plate 10 having regions of different light transmittances, and controlling the exposure time to be T1, so that a region where an orthographic projection of the first photoresist layer 10 on the base substrate 100 overlaps an orthographic projection of the completely transparent region (100% light transmittance) on the base substrate 100 is the photoresist non-retention region, the rest region is the photoresist retention region. Photoresist of the first photoresist layer corresponding to the completely transparent region is modified, and is removed by developing; the second conductive film layer 40 is etched to form the source electrode 501*a* and the drain electrode 501*b* of the thin film transistor, the second auxiliary electrode 400, the data lines 700, and the auxiliary electrode lines 800, and the remaining photoresist 201*a* is removed, that is, the second conductive pattern is formed. A length of each of the source and drain electrodes of the formed thin film transistor is a first distance L1; an area of the second auxiliary electrode is a first area S1.

Referring to FIGS. 7 and 11, when the operating frequency band of the pixels is required to be the second preset frequency band, the step S14 may include: sequentially forming the second conductive film 40 and the first photoresist layer 20 on a side of the first interlayer insulating layer 900 away from the base substrate 100, exposing the first photoresist layer with the mask plate 10 having regions of different light transmittances, and controlling the exposure time to be T2 (T2>T1), so that a region where an orthographic projection of the first photoresist layer 20 on the base substrate 100 overlaps orthographic projections of the completely transparent region (100% light transmittance) and the first partially transparent region (60% light transmittance) on the base substrate 100 is the photoresist non-retention region, the rest region is the photoresist retention region. Photoresist of the first photoresist layer 20 corresponding to the completely transparent region (100% light transmittance) and the first partially transparent region (60% light transmittance) is modified, and is removed by developing; the second conductive film layer is etched to form the source electrode 501*a* and the drain electrode 501*b* of the thin film transistor, the second auxiliary electrode 400, the data lines 700, and the auxiliary electrode lines 800, and the remaining photoresist 201*b* is removed, that is, the second conductive pattern is formed. A length of each of the source and drain electrodes 501*a* and 501*b* of the formed thin film transistor is a second distance L2 (L2<L1); an area of the second auxiliary electrode 400 is a second area S2 (S2<S1).

Referring to FIGS. 8 and 12, when the operating frequency band of the pixels is required to be the third preset frequency band, the step S14 may include: sequentially forming the second conductive film 40 and the first photoresist layer 20 on a side of the first interlayer insulating layer 900 away from the base substrate 100, exposing the first photoresist layer 20 with the mask plate 10 having regions of different light transmittances, and controlling the exposure time to be T3 (T3>T2), so that a region where an orthographic projection of the first photoresist layer 20 on the base substrate 100 overlaps orthographic projections of the completely transparent region (100% light transmittance), the first partially transparent region (60% light transmittance) and the second partially transparent region (30% light transmittance) on the base substrate 100 is the photoresist non-retention region, the rest region is the photoresist retention region. Photoresist of the first photoresist layer 20 corresponding to the completely transparent region (100% light transmittance), the first partially transparent region (60% light transmittance) and the second partially transparent region (30% light transmittance) is modified, and is removed by developing; the second conductive film layer is etched to form the source electrode 501*a* and the drain electrode 501*b* of the thin film transistor, the second auxiliary electrode 400, the data lines 700, and the auxiliary electrode lines 800, and the remaining photoresist 201*c* is removed, that is, the second conductive pattern is formed. A length of each of the source and drain electrodes 501*a* and 501*b* of the formed thin film transistor is a third distance L3 (L3<L2); an area of the second auxiliary electrode 400 is a second area S3 (S3<S2).

It should be noted that the width-to-length ratio of the channel depends on the length of each of the source electrode 501*a* and the drain electrode 501*b* of the thin film transistor, and the greater the distance (i.e., the length) is, the greater the width-to-length ratio is. A capacitance of the first storage capacitor Cst1 formed by the second auxiliary electrode 400 and the first auxiliary electrode 300, and a capacitance of the second storage capacitor Cst2 formed by the second auxiliary electrode 400 and the pixel electrode 200 depend on the area of the second auxiliary electrode 400. Therefore, when the operating frequency band of the pixels is required to be the first preset frequency band, the channel width-to-length ratio of the formed thin film transistor 500 is the greatest, and the sum of the capacitance of the first storage capacitor Cst1 and the capacitance of the second storage capacitor Cst2 is the greatest. Such a display substrate may be used in a product operating at a low frequency, such as an outdoor display board, an electronic tag etc., which may effectively reduce the power consumption. When the operating frequency band of the pixels is required to be the second preset frequency band, the channel width-to-length ratio of the formed thin film transistor 500 is moderate, and the sum of the capacitance of the first storage capacitor Cst1 and the capacitance of the second storage capacitor Cst2 is moderate. Such a display substrate may be used in a product operating at an intermediate frequency. When the operating frequency band of the pixels is required to be the third preset frequency band, the channel width-to-length ratio of the formed thin film transistor 500 is the minimum, and the sum of the capacitance of the first storage capacitor Cst1 and the capacitance of the second storage capacitor Cst2 is the minimum. Such a display substrate may be used in a product operating at a high frequency, such as an e-book, etc., which may effectively avoid the display delay.

S15, forming a second interlayer insulating layer 1000 on the second conductive pattern, and forming a second via c and a second sub-via b extending through the second interlayer insulating layer 1000; wherein orthographic projections of the first sub-via a and the second sub-via b on the base substrate at least partially overlap each other.

In some examples, a material of the second interlayer insulating layer 1000 may be silicon dioxide, silicon nitride, a high dielectric constant material, or the like.

In some examples, the step S15 may include forming a second insulating film on the base substrate 100 formed with the second conductive pattern by any one of a plurality of methods, such as deposition, coating, sputtering, etc., and then performing a patterning process on the second insulating film to form the second interlayer insulating layer 1000.

S16, forming a pixel electrode 200 on the second interlayer insulating layer 1000; wherein the pixel electrode 200 is connected to the first auxiliary electrode 300 through the first and second sub-vias a and b, and is connected to the drain electrode 501b of the thin film transistor through the second via c.

In some examples, a material of the pixel electrode 200 may include: a transparent conductive material, such as indium tin oxide (ITO) or indium zinc oxide (IZO).

In some examples, the step S16 may include forming a pixel electrode film on the base substrate 100 on which the second interlayer insulating layer 1000 is formed by any one of a plurality of methods, such as deposition, coating, sputtering, etc., and then performing a patterning process on the pixel electrode film to form the pixel electrode 200.

It may be clearly understood by one of ordinary skill in the art that, for convenience and simplicity of description, the operating principle and the connection relationship of each structure in the display substrate described above may refer to the corresponding content in the embodiment of the structure of the display substrate, and are not described herein again.

It should be understood that the above embodiments are merely exemplary embodiments adopted to explain the principles of the present disclosure, and the present disclosure is not limited thereto. It will be apparent to one of ordinary skill in the art that various changes and modifications may be made therein without departing from the spirit and scope of the present disclosure, and such changes and modifications also fall within the scope of the present disclosure.

What is claimed is:

1. A method for manufacturing a display substrate having a plurality of pixels, the method comprising:

providing a base substrate;

forming a first conductive film on the base substrate, and patterning the first conductive film to form a gate electrode of a thin film transistor and a first auxiliary electrode;

forming a first interlayer insulating layer on a side of the first auxiliary electrode away from the base substrate;

sequentially forming a second conductive film and a first photoresist layer on a side of the first interlayer insulating layer away from the base substrate, exposing the first photoresist layer for a preset exposure time with a mask plate having regions of different light transmittances, to form a source electrode and a drain electrode of the thin film transistor and a second auxiliary electrode; wherein orthographic projections of the first auxiliary electrode and the second auxiliary electrode on the base substrate at least partially overlap each other to form a first storage capacitor;

forming a second interlayer insulating layer on a side of a layer, where the second auxiliary electrode is located, away from the base substrate;

patterning the first interlayer insulating layer and the second interlayer insulating layer to form a first via extending through the first interlayer insulating layer and the second interlayer insulating layer, and a second via extending through the second interlayer insulating layer, wherein the drain electrode of the thin film transistor is exposed by the second via, and the first auxiliary electrode is exposed by the first via; and forming a pixel electrode on a side of the second interlayer insulating layer away from the base substrate; wherein the pixel electrode is connected to the drain electrode of the thin film transistor through the second via; and the pixel electrode is electrically connected to the first auxiliary electrode through the first via extending through the first interlayer insulating layer and the second interlayer insulating layer, and the orthographic projection of the second auxiliary electrode on the base substrate and an orthographic projection of the pixel electrode on the base substrate at least partially overlap each other to form a second storage capacitor;

wherein the mask plate having regions of different transmittances comprises a completely transparent region, an opaque region, and a plurality of partially transparent regions; and the sequentially forming a second conductive film and a first photoresist layer on a side of the first interlayer insulating layer away from the base substrate, exposing the first photoresist layer for a preset time with a mask plate having regions of different light transmittances, to form a source electrode and a drain electrode of the thin film transistor and a second auxiliary electrode, specifically comprises:

forming the first storage capacitor and the second storage capacitor based on requirements on an operating frequency band of the display panel, to obtain an area of the orthographic projection of the second auxiliary electrode on the base substrate;

controlling the exposure time to control light outgoing amount of the plurality of partially transparent regions and control a size of a photoresist retention region of the first photoresist layer; and removing photoresist in a photoresist non-retention region of the first photoresist layer, and forming the source electrode and the drain electrode of the thin film transistor and the second auxiliary electrode by etching and developing.

2. The method for manufacturing a display substrate according to claim 1, wherein the plurality of partially transparent regions comprise a first partially transparent region and a second partially transparent region, and a light transmittance of the first partially transparent region is greater than that of the second partially transparent region; and where the operating frequency band of the pixels is required to be a first preset frequency band, the sequentially forming a second conductive film and a first photoresist layer on a side of the first interlayer insulating layer away from the base substrate, exposing the first photoresist layer with a mask plate having regions of different light transmittances and controlling the exposure time based on requirements on the operating frequency band of the pixels to form a source electrode and a drain electrode of the thin film transistor and a second auxiliary electrode, specifically comprises:

sequentially forming the second conductive film and the first photoresist layer on a side of the first interlayer insulating layer away from the base substrate, exposing the first photoresist layer with the mask plate having regions of different light transmittances, and controlling the exposure time to be T1, such that a region of the first photoresist layer which has an orthographic projection on the base substrate overlapping an orthographic projection of the completely transparent region on the base substrate is the photoresist non-retention region, and a remaining region of the first photoresist layer is the photoresist retention region;

removing photoresist in the photoresist non-retention region of the first photoresist layer; and etching and developing the second conductive film to form the source electrode and the drain electrode of the thin film transistor and the second auxiliary electrode, and removing remaining photoresist; wherein a length of each of the source electrode and the drain electrode of the thin film transistor is a first distance L1; an area of the second auxiliary electrode is a first area S1;

where the operating frequency band of the pixels is required to be a second preset frequency band, the sequentially forming a second conductive film and a first photoresist layer on a side of the first interlayer insulating layer away from the base substrate, exposing the first photoresist layer with a mask plate having regions of different light transmittances and controlling the exposure time based on requirements on the operating frequency band of the pixels to form a source electrode and a drain electrode of the thin film transistor and a second auxiliary electrode, specifically comprises:

sequentially forming the second conductive film and the first photoresist layer on a side of the first interlayer insulating layer away from the base substrate, exposing the first photoresist layer with the mask plate having regions of different light transmittances, and controlling the exposure time to be T2, such that a region of the first photoresist layer which has an orthographic projection on the base substrate overlapping orthographic projections of the completely transparent region and the first partially transparent region on the base substrate is the photoresist non-retention region, a rest region of the first photoresist layer is the photoresist retention region;

removing photoresist in the photoresist non-retention region of the first photoresist layer; and etching the second conductive film to form the source electrode and the drain electrode of the thin film transistor and the second auxiliary electrode, and removing remaining photoresist; wherein a length of each of the source electrode and the drain electrode of the thin film transistor is a second distance L2; an area of the second auxiliary electrode is a second area S2; and where the operating frequency band of the pixels is required to be a third preset frequency band, the sequentially forming a second conductive film and a first photoresist layer on a side of the first interlayer insulating layer away from the base substrate, exposing the first photoresist layer with a mask plate having regions of different light transmittances and controlling the exposure time based on requirements on the operating frequency band of the pixels to form a source electrode and a drain electrode of the thin film transistor and a second auxiliary electrode, specifically comprises:

sequentially forming the second conductive film and the first photoresist layer on a side of the first interlayer insulating layer away from the base substrate, exposing the first photoresist layer with the mask plate having regions of different light transmittances, and controlling the exposure time to be T3, such that a region of the first photoresist layer which has an orthographic projection on the base substrate overlapping orthographic projections of the completely transparent region, the first partially transparent region and the second partially transparent region on the base substrate is the photoresist non-retention region, a rest region of the first photoresist layer is the photoresist retention region;

removing photoresist in the photoresist non-retention region of the first photoresist layer; and etching the second conductive film to form the source electrode and the drain electrode of the thin film transistor and the second auxiliary electrode, and removing remaining photoresist; wherein a length of each of the source electrode and the drain electrode of the thin film transistor is a third distance L3; an area of the second auxiliary electrode is a third area S3;

wherein a maximum frequency value in the first preset frequency band is less than a minimum frequency value in the second preset frequency band, and a maximum frequency value in the second preset frequency band is less than a minimum frequency value in the third preset frequency band; T1<T2<T3; L3<L2<L1; S3<S2<S1.

3. The method for manufacturing a display substrate according to claim 1, further comprising forming the gate electrode of the thin film transistor while forming the first auxiliary electrode on the base substrate.

4. The method for manufacturing a display substrate according to claim 1, wherein
the second auxiliary electrodes of pixels in a same column are connected to a same auxiliary electrode line, to which a common voltage signal is applied.

5. The method for manufacturing a display substrate according to claim 1, further comprising: before the sequentially forming a second conductive film and a first photoresist layer on a side of the first interlayer insulating layer away from the base substrate, exposing the first photoresist layer with a mask plate having regions of different light transmittances to form a source electrode and a drain electrode of the thin film transistor and a second auxiliary electrode, forming an active layer of the thin film transistor on the side of the first interlayer insulating layer away from the base substrate.

6. The method for manufacturing a display substrate according to claim 1, further comprising: while the sequentially forming a second conductive film and a first photoresist layer on a side of the first interlayer insulating layer away from the base substrate, exposing the first photoresist layer with a mask plate having regions of different light transmittances to form a source electrode and a drain electrode of the thin film transistor and a second auxiliary electrode, forming a data line and an auxiliary electrode line, wherein the data line is electrically connected to the source electrode of the thin film transistor; and the auxiliary electrode line is connected to the second auxiliary electrode.

7. The method for manufacturing a display substrate according to claim 6, wherein an extending direction of the data line is parallel or substantially parallel to that of the auxiliary electrode line.

8. The method for manufacturing a display substrate according to claim 1, wherein the pixel comprises two thin film transistors connected in series.

9. A display substrate having a plurality of pixels, wherein in at least one of the plurality of pixels, the display substrate comprises:

a base substrate;

a thin film transistor on the base substrate and comprising a gate electrode, a source electrode and a drain electrode;

a first auxiliary electrode, a second auxiliary electrode and a pixel electrode sequentially arranged on the base substrate, wherein orthographic projections of the first auxiliary electrode, the second auxiliary electrode and the pixel electrode on the base substrate at least partially overlap each other;

a first interlayer insulating layer between a layer where the first auxiliary electrode is located and a layer where the second auxiliary electrode is located, such that the first auxiliary electrode is insulated from the second auxiliary electrode; and a second interlayer insulating layer between the layer where the second auxiliary electrode is located and a layer where the pixel electrode is located, such that the second auxiliary electrode is insulated from the pixel electrode; wherein the source electrode and the drain electrode of the thin film transistor and the second auxiliary electrode are arranged in a same layer and are made of a same material; the pixel electrode is connected to the drain electrode of the thin film transistor through a second via extending through the second interlayer insulating layer, and the pixel electrode is electrically connected to the first auxiliary electrode through a first via extending through the first interlayer insulating layer and the second interlayer insulating layer;

wherein where an operating frequency band of the pixels is a first preset frequency band, a length of each of the source electrode and the drain electrode of the thin film transistor is a first distance L1; an area of the second auxiliary electrode is a first area S1;

where the operating frequency band of the pixels is a second preset frequency band, a length of each of the source electrode and the drain electrode of the thin film transistor is a second distance L2; an area of the second auxiliary electrode is a second area S2; and where the operating frequency band of the pixels is a third preset frequency band, a length of each of the source electrode and the drain electrode of the thin film transistor is a third distance L3; an area of the second auxiliary electrode is a third area S3; and wherein a maximum frequency value in the first preset frequency band is less than a minimum frequency value in the second preset frequency band, and a maximum frequency value in the second preset frequency band is less than a minimum frequency value in the third preset frequency band; $L3<L2<L1$; $S3<S2<S1$.

10. The display substrate according to claim 9, wherein the second auxiliary electrodes of pixels in a same column are connected to a same auxiliary electrode line, to which a common voltage signal is applied.

11. The display substrate according to claim 9, wherein the first auxiliary electrode and the gate electrode of the thin film transistor are in a same layer and are made of a same material.

12. The display substrate according to claim 9, further comprising a data line and an auxiliary electrode line, wherein the data line, the auxiliary electrode line and the second auxiliary electrode are in a same layer and are made of a same material; the data line is electrically connected to the source electrode of the thin film transistor; and the auxiliary electrode lines is connected to the second auxiliary electrode.

13. The display substrate according to claim 12, wherein an extending direction of the data line is parallel or substantially parallel to that of the auxiliary electrode line.

14. The display substrate according to claim 9, wherein the pixel comprises two thin film transistors connected in series.

15. The display substrate according to claim 14, wherein the two thin film transistors comprise a first thin film transistor and a second thin film transistor, the source electrode of the second thin film transistor is connected to the drain electrode of the first thin film transistor, and the pixel electrode is connected to the drain electrode of the second thin film transistor, the first thin film transistor further comprises a first active layer lapping the source electrode and the drain electrode of the first thin film transistor, respectively, and the second thin film transistor further comprises a second active layer lapping the source electrode and the drain electrode of the second thin film transistor, respectively;

in a direction perpendicular to a direction from the source electrode of the first thin transistor to the drain electrode of the second thin transistor, the source electrode comprises a first terminal and a second terminal opposite to each other, and the first active layer comprises a third terminal close to the first terminal and a fourth terminal close to the second terminal, and a distance between the first terminal and the third terminal is smaller than that between the second terminal and the fourth terminal.

16. A display apparatus, comprising the display substrate according to claim 9.

17. The display apparatus according to claim 16, wherein the display apparatus is an electronic paper display apparatus; and the electronic paper display apparatus further comprises a cover plate opposite to the display substrate, and an electrophoresis layer between the display substrate and the cover plate.

18. The display substrate according to claim 9, wherein
the thin film transistor further comprises an active layer lapping the source electrode and the drain electrode, respectively;
in a direction perpendicular to a direction from the source electrode to the drain electrode, the source electrode comprises a first terminal and a second terminal opposite to each other, and the active layer comprises a third terminal close to the first terminal, and a fourth terminal close to the second terminal, and
a distance between the first terminal and the third terminal is smaller than that between the second terminal and the fourth terminal.

\* \* \* \* \*